(12) United States Patent
Nakanishi et al.

(10) Patent No.: US 6,847,113 B2
(45) Date of Patent: Jan. 25, 2005

(54) ELECTRONIC APPARATUS WITH PLATE-LIKE MEMBER HAVING PLURAL RECESSES CONTAINING HEAT ACCUMULATING MATERIAL

(75) Inventors: Masato Nakanishi, Chiyoda (JP); Shigeo Ohashi, Tsuchiura (JP); Shigeki Hirasawa, Ishioka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/419,943

(22) Filed: Apr. 22, 2003

(65) Prior Publication Data

US 2004/0056348 A1 Mar. 25, 2004

(30) Foreign Application Priority Data

Sep. 19, 2002 (JP) ........................................ 2002-272437

(51) Int. Cl.[7] .............................................. H01L 23/34
(52) U.S. Cl. ...................... 257/712; 257/713; 257/717; 257/718; 257/719; 257/720
(58) Field of Search ................................ 257/712, 713, 257/717, 718, 719, 720

(56) References Cited

FOREIGN PATENT DOCUMENTS

JP          06-214067          8/1994     ........... G12B/15/06

*Primary Examiner*—Nathan J. Flynn
*Assistant Examiner*—Remmon R. Fordé
(74) *Attorney, Agent, or Firm*—Antonelli, Terry, Stout & Kraus, LLP

(57) ABSTRACT

An electronic apparatus, including a plate-like member, enclosing a heat-accumulating material of latent heat type within an inside thereof; a semiconductor element, being connected with the member, thermally; and a housing covering the semiconductor element and the member. A surface of the member, in contact with the semiconductor element, is provided with recess-portions in plural numbers thereof, each being recessed in a direction of the heat-accumulating material of latent heat type, so as to enclose the heat-accumulating material of latent heat type into the recess portions. The plate-like member and the housing are connected with each other, thermally, thereby providing a cooling device, being able to cool the electronic circuit component(s) building up the electronic apparatus, as well as being superior in operability.

3 Claims, 5 Drawing Sheets

ELECTRONIC APPARATUS WITH PLATE-LIKE MEMBER HAVING PLURAL RECESSES CONTAINING HEAT ACCUMULATING MATERIAL

BACKGROUND OF THE INVENTION

The present invention relates to an electronic apparatus mounting a heat-generating element(s) therein.

Conventionally, in Japanese Patent Laying-Open No. Hei 6-214067 (JP-A 214067 (1994)), for example, there is disclosed that a heat-accumulating member is attached onto a heat-generating element, in particular, on page 2 and FIG. 1 thereof.

In general, paraffin is used to be such the heat-accumulating material.

Though the paraffin shows a heat-absorption effect at the highest, in particular, during the time when it changes from a solid condition into a liquid condition, however to begin with, since the paraffin itself is inferior in the heat conductivity thereof, the larger in an area in contact with between the heat-generating element and the paraffin, the higher an effect thereof.

However, with such the surface contact with the semiconductor element, in relation to the prior art mentioned above, there is a restriction or limit on the contacting area, and it takes a time to transfer the heat into an entire of the heat-accumulating element, thereby bringing about a problem of lowering the thermal responsibility in the heat-accumulating material.

BRIEF SUMMARY OF THE INVENTION

An object is, according to the present invention, to provide a portable-type electronic apparatus comprising a heat-accumulating member having a high thermal responsibility, therein.

For accomplishing the object mentioned above, according to the present invention, there is provided an electronic apparatus, comprising: a plate-like member or container, enclosing a heat-accumulating material of latent heat type within an inside thereof; a semiconductor element, being connected with said member or container, thermally; and a housing covering said semiconductor element and said member or container, wherein a surface of said member or container, in contact with said semiconductor element, is provided with recess portions in plural numbers thereof, each being recessed in a direction of said heat-accumulating material of latent heat type, so as to enclose said heat-accumulating material of latent heat type into said recess portions, and said plate-like member or container and said housing are connected with each other, thermally.

Also, according to the present invention, the object mentioned above is accomplished by the electronic apparatus as described in the above, wherein a recess portion is provided in said plate-like container, which encloses the heat-accumulating material of latent heat type therein, and a material of heat conductivity is inserted into said recess portion.

And, according to the present invention, the object mentioned above is also accomplished by the electronic apparatus as described in the above, further comprising a means for detecting either one of temperature of said heat-accumulating material of latent heat type and an operation time of said apparatus, and a display portion inputting an output from said detecting means, so as to display a content detected by said detecting means thereupon.

BRIEF DESCRIPTION OF THE SEVERAL VIEWS OF THE DRAWING

Those and other objects, features and advantages of the present invention will become more readily apparent from the following detailed description, when taken in conjunction with the accompanying drawings wherein.

DETAILED DESCRIPTION OF THE INVENTION

In recent years, accompanying with wide spread thereof, a portable telephone apparatus is in a direction or tendency of further adding supplemental values or performances thereto. For instance, they are such telephone apparatuses, having a camera, being able to transfer the moving video therein/from, and being able to enjoy music therewith, and it is considered that such the requirement of adding the high supplemental values or performances onto the telephone apparatus comes up to be further high and/or various in the feature.

In a case where the portable telephone apparatus has such a function as a sort of an information terminal device or apparatus, in which various kinds of software are installed, for example, of course a semiconductor element within an inside of the portable telephone apparatus produces high-heat generation therefrom, therefore cooling is necessary for such the semiconductor element, corresponding to such the high-heat generation.

At present, heat-radiation in the general portable telephone apparatus is achieved by transferring the heat generated from the semiconductor to a housing, which forms an outer configure of the portable telephone apparatus, however up to the present time, since the temperature of heat-generation is not so high in the portable telephone apparatus, therefore it gives no uncomfortable feeling to a user if transferring the heat to the housing, such as, heating hot in her/his hand.

However, if the temperature of the semiconductor element comes up to 50–60° C., similar to a portable information terminal device or apparatus (such as, a personal computer, for example), the housing of the portable telephone apparatus becomes hot, therefore it is highly possible that it gives the uncomfortable feeling to the user.

Then, according to the present invention, studies are made on cooling with using a heat-accumulating material, which is effective for cooling effect thereof.

Figure 1:
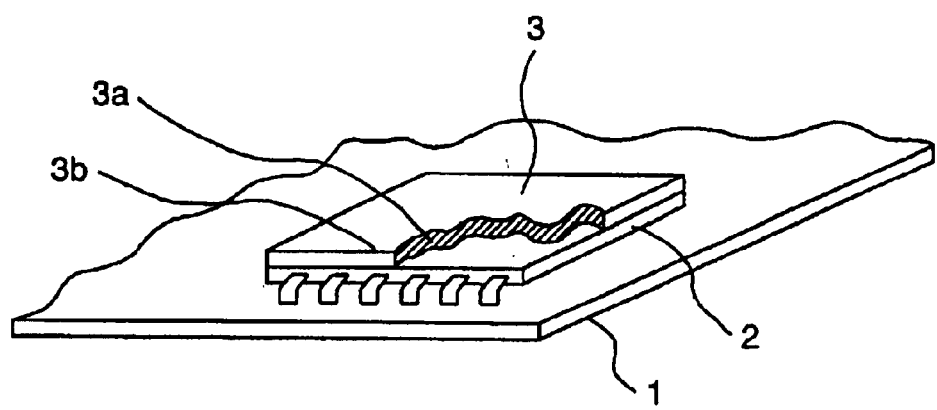
FIG. 1 is a perspective view of an electronic apparatus, having a general heat-accumulating member therein.

A general cooling structure with using such the heat-accumulating material is shown, for example, in FIG. 1.

FIG. 1 is a perspective view of a cooling device, in which the heat-accumulating material is enclosed in a package.

In FIG. 1, a reference numeral 1 indicates a substrate (such as, a wiring board), 2 an electronic circuit component, and 3 a cooling device, respectively.

The cooling device 3 has a package 3a, in which is enclosed a heat accumulating material 3b of the latent heat type (such as, a heat accumulating material of the paraffinic group). The cooling device 3 is mounted under the condition of being in contact with the electronic circuit component 2, so as to transfer the heat generated within the electronic circuit component 2 through the package 3a to the heat accumulating material 3b of the latent heat type, thereby achieving the cooling of the electronic circuit component 2.

In this instance, heat accumulating material 3b of the latent heat type changes the condition thereof from a solid into a liquid via melting or fusing thereof. This changing brings about a time period, for absorbing the heat therein, most effectively.

After cooling the electronic circuit component in this manner, the heat accumulating material of the latent heat type, being changed into the liquid condition, transfers the heat within the heat accumulating material to a housing when an electric power source of the electronic apparatus is turned OFF or it stops transmission, and then the heat accumulating material of the latent heat type turns back to the initial solid condition through radiating the heat from the housing, etc.

When the heat is transferred or conducted from the plate-type heat accumulating package, since the heat conductivity of the heat accumulating material is very small or low, the heat cannot be conducted into an entire of the heat accumulating material; therefore there is a possibility that the effect of heat accumulation is lowered down.

In particular, since mostly the portable information terminal device is operated by a finger under the condition of being held in a palm, it has a specialty that the housing should not be hot, and therefore there is a necessity of studying an electronic apparatus, which can avoid the heat conduction to the housing as far as possible, while increasing the effect of heat accumulation of the heat accumulating material.

According to the present invention, having made various studies on the electronic apparatus, having therein a heat accumulating material, being effective even when received, such as in a portable telephone apparatus, which has only a very narrow portion as a space for storing or receiving the heat accumulating material therein, and can be obtained the following embodiments.

Hereinafter, embodiments according to the present invention will be fully explained by referring to the attached drawings.(Though the description is made on the information terminal device or apparatus of such the type of the portable telephone apparatus, as a model thereof, for example, in the present embodiments, however, it may be one, which is similar to the style of the conventional notebook-type personal computer; thus it should not be restricted only to the portable telephone apparatus.)

Figure 2A:
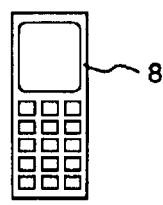
FIGS. 2(A) to 2(C) show a portable-type electronic apparatus, according to one embodiment of the present invention, and a top view and a partial cross-section view thereof, respectively.
Figure 2B:
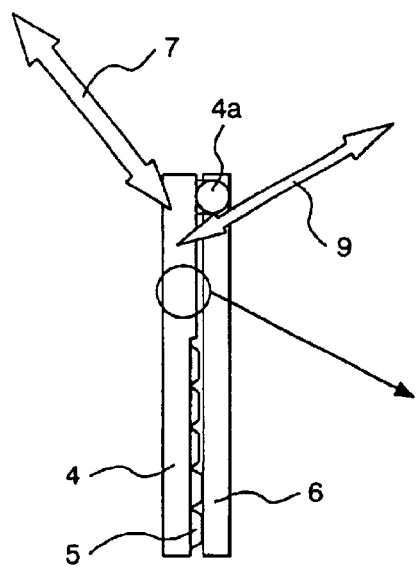

FIGS. 2(A) and 2(B) shows an electronic apparatus, having a cooling device therein, according to an embodiment of the present invention, and a partial cross-section view thereof.

In FIG. 2(B), a portable-type information terminal device 4, such as, a portable telephone device, a portable terminal device, or a notebook-type personal computer, etc., for example, comprises an operation portion 5 and a display portion 6. A reference numeral 4a indicates a hinge, and the operation portion 5 and the display portion 6 are connected with each other, so that they can be folded by means of the hinge 4a. Though not shown in the figures, however they are opened on a boundary of the hinge 4a when the device is used.

The portable information terminal device 4 can receive information 7 even in the conditions when it is not operated, under the heat insulating environment, such as, within an inside of a bag or a pocket, for example.

In FIG. 2(A), a reference numeral 8 is a wireless terminal device, for example, and communication of information 9 can be conducted between this wireless terminal device 8 and the portable-type information terminal device 4.

Figure 2C:
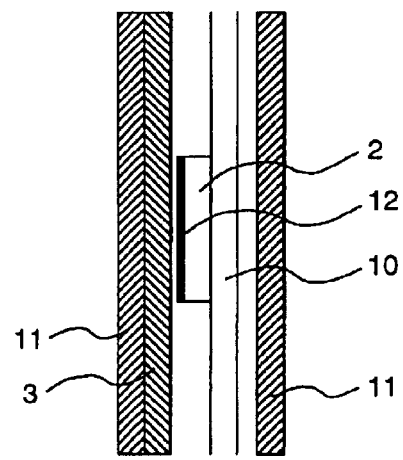

Referring to FIG. 2(C), within an inside of the portable-type information terminal device are mounted a wiring board 10, on which is mounted a semiconductor element or device 2, generating heat therein, and a cooling device 3, receiving a heat accumulating material therein. The heat generating from the semiconductor device 2 is radiated into an outer air from the surface of a case 11. Both the heat-generating device 2 and the cooling device 3 are in contact with each other through a sheet 12 of heat conducting property. As the heat accumulating material within the cooling device 3 may be used one of the phase-change type, such as paraffin, etc., for example, and/or a material having a large heat capacity though showing no such the phase-change.

Further, it is preferable to attach a detection means for detecting temperature at a specific portion in the portable-type information terminal device 4 (for example, the surface temperature of the semiconductor device or a housing thereof), and further temperature of the heat accumulating material, an operation time of the terminal device, and/or an amount of heat accumulation of the heat accumulating material under the condition where the terminal device is positioned (such as, within a bag or a car, etc., being very inferior in the condition of heat radiation, for example). In this instance, through transmission of the information 9, depending upon the detected content, onto the display portion of the wireless terminal device 8 being operated by an operator, it is possible to transmit the information to the operator, for example, of an amount of heat accumulation within the heat accumulating material, necessity of changing the heat accumulating material, limit of use of the device, etc.

Figure 3:
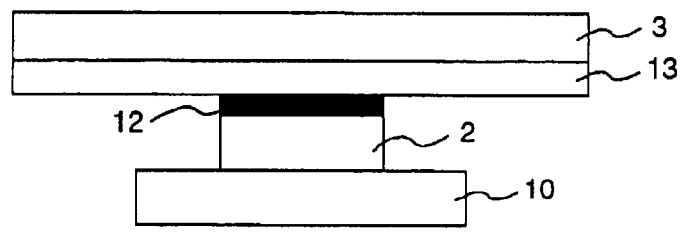
FIG. 3 is a partial cross-section view of a cooling device, according to other embodiment of the present invention.

FIG. 3 is a view for showing a relationship of connection between the semiconductor element or device and the heat accumulating material.

In FIG. 3, the semiconductor device 2 generating heat therein is mounted on the wiring board 10. On the semiconductor device 2 is provided the sheet 12 of heat conductive property. For the purpose of achieving uniform heat distribution upon a heating surface of the cooling device 3, which receives the heat accumulating material therein, a heat spreader 13 is provided between the cooling device 3 and the heat conductive sheet 12. With an aid of this heat spreader sheet 13, the heat from the semiconductor device 2 is spread into the surface direction of the heat spreader 13, thereby transmitting the heat into a front surface of the cooling device 3 effectively.

Figure 4:
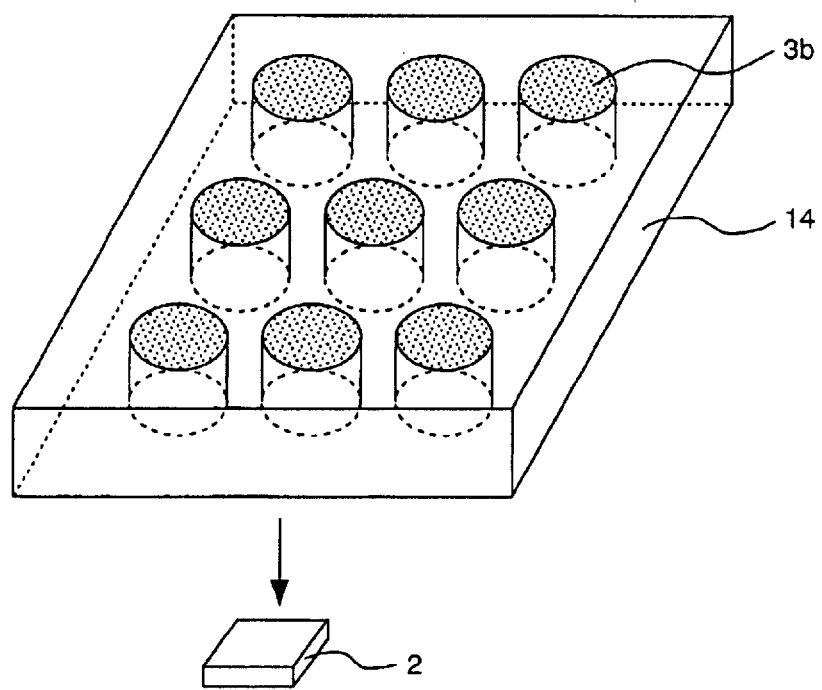
FIG. 4 is a perspective view of a cooling device, according to further other embodiment of the present invention.

FIG. 4 is a perspective view for showing the cooling device, according to other embodiment of the present invention.

As is shown in FIG. 4, plural numbers of recess portions 3b are provided on a flat plate or container 14. Within an inside of each recess portion 3b is enclosed the heat accumulating material. This flat plate 14 is connected with the heat-generating element 2 within the portable-type information terminal device 4.

With this, the heat generated from the heat-generating element 2 is conducted, first, into an inside of the flat plate 14 having those recess portions 3b of high heat conductivity. Thereafter, the heat is conducted from the flat plate 14 to the heat accumulating material, thereby being accumulated therein.

And, according to the present embodiment, it is also possible to obtain the similar effect to that obtained with the embodiment mentioned in the above, by enclosing the heat conductive material within the recess portions 3b, so as to conduct or transfer the heat absorbed from the semiconductor device into the heat accumulating material enclosed inside the flat plate 14. This is because the contact area is enlarged between the heat accumulating material and the heat conductive material.

According to the present embodiment, the heat conducting into the heat accumulating material is transferred, not only in the direction being orthogonal to the heat-generating element, but also in the surface direction on the flat plate 14, so that the heat conducting area can be enlarged between the heat accumulating material and the heat, thereby increasing the effect of conducting the heat into the heat accumulating material.

Figure 5:
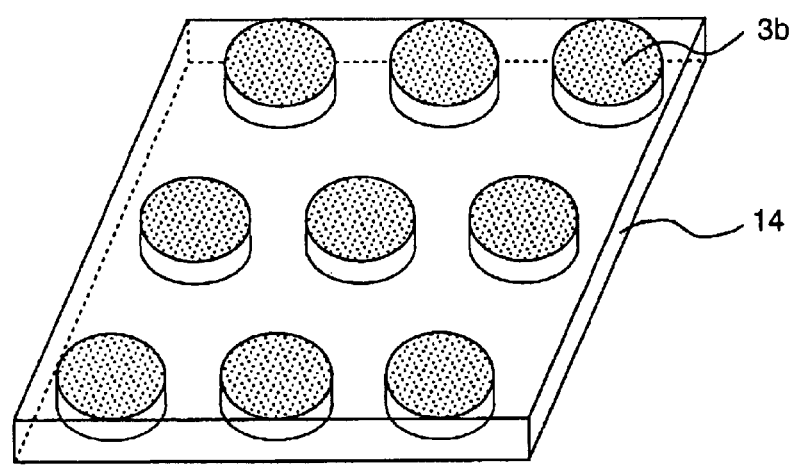
FIG. 5 is also a perspective view of a cooling device, according to further other embodiment of the present invention.

FIG. 5 is a perspective view of a cooling device according to other embodiment of the present invention.

In FIG. 5, recesses 3b are formed on the flat plate 14, each being in a semi-sphere shape for receiving the heat accumulating material therein. Entering the heat accumulating material into those recess 3b increases the contact area between the heat accumulating material and the flat plate 14, thereby rising up the heat conducting effect into the heat accumulating material.

Figure 6:
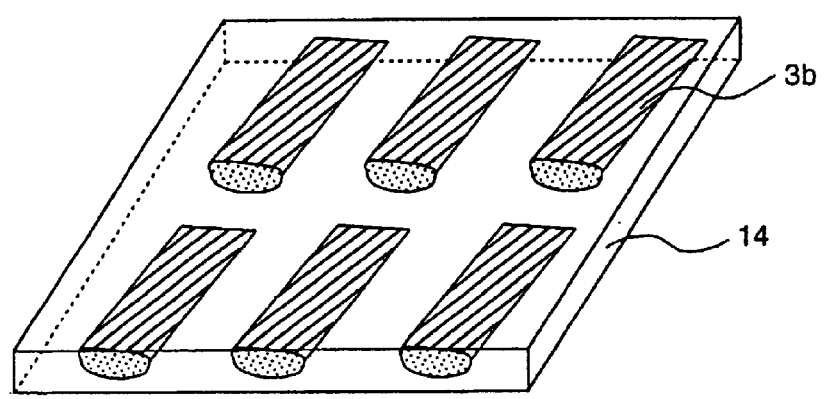
FIG. 6 is further a perspective view of a cooling device, according to further other embodiment of the present invention.

FIG. 6 is a perspective view of a cooling device according to further other embodiment of the present invention.

In FIG. 6, recesses 3b are formed on the flat plate 14, each being in a semi-cylindrical shape for receiving the heat accumulating material therein. Entering the heat accumulating material into those recess 3b increases the contact area between the heat accumulating material and the flat plate 14, thereby rising up the heat conducting effect into the heat accumulating material.

Figure 7A:
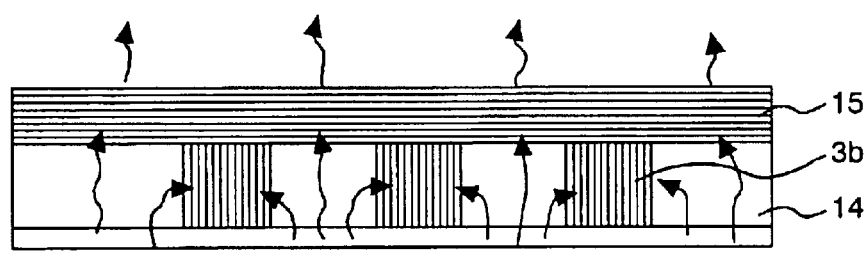
FIG. 7 is a cross-section view of a cooling device, according to further other embodiment of the present invention.
Figure 7B:
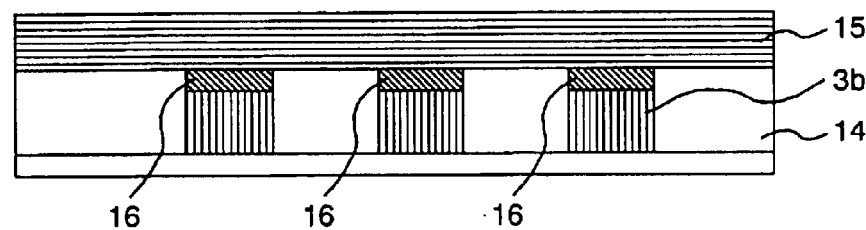

FIGS. 7(A) and 7(B) are the cross-section views of the cooling devices according to further other embodiments of the present invention.

In FIG. 7(A), the recesses 3b are provided on a flat plate 14 of high heat conductivity, by means of the forging, for example, and into an inside of each of those recessed 3b is enclosed the heat accumulating material of the latent heat type. Upon an upper portion of the flat plate 14 is connected a heat-radiation plate 15, thermally.

Each the recess 3b, having the heat accumulating material therein, is put between the flat plate 14 and the heat radiation plate, therefore the flat plate 14 and the heat radiation plate 15 are connected with each other, thermally.

With this structure, the contact area can be increased between the heat accumulating material and the flat plate 14, so that the heat can be conducted into the heat accumulating material easily, thereby increasing the effect of hear accumulation.

Further, when the heat accumulating material 3b reduces the volume thereof through repetition of the phase-change, an air gap is formed between the heat accumulating material 3b and the heat radiating plate 15, thereby deteriorating the heat conductivity from the heat accumulating member 3b to the heat radiating plate 15. However, in the case of this structure, the heat is conducted from the flat plate 14 to the heat radiating plate 15 even if such the air gap is formed between the heat accumulating material 3b and the heat radiating plate 15, therefore it is possible to prevent the heat from flowing into the heat accumulating material, in an amount being equal or greater than the latent heat of fusion or melting thereof.

Upon selection of the heat accumulating material, a paraffinic resin is used, which has the melting point from 60° C. to 80° C., by taking the junction temperature of a LSI mounted in the portable apparatus into the consideration. In this instance, if using 1.3 g of the paraffin, which has the latent heat of fusion of 178.4 kJ/kg, the paraffin mentioned above starts the phase-change in response to an amount of heat input of 1,068 W/m$^2$ (at the time when applying 3 W onto a area of 53 mm×53 mm) within about 80 seconds, and thereafter, it maintains the heat-accumulating effect for about 250 seconds, thereby obtaining the effect of heat accumulation of about 1W for that instance. Also, according to one embodiment of the present invention, it is also possible that the heat-radiating plate 15 is a side surface of the housing. In that instance, attachment of the housing may be made by means of a screw, etc. And also, it is possible to provide a lib in the recess for maintaining the strength of the flat plate.

In FIG. 7(B), there may be a case where the volume of the heat accumulating member is shrunk through repetition of the phase-change therein from the solid into the liquid. In that instance, an air layer is generated between the heat-accumulating member and the heat radiating plate. In such the instance, it is possible to transfer or conduct the heat from the heat-accumulating material into the heat-radiating plate through a water, for example, by inserting a material 16 having the heat conductivity being larger than that of the air in the recesses at the position of the air layer.

As was mentioned in the above, according to the present embodiment, the heat generated in the electronic circuit component is conducted into the heat-accumulating member through the flat plate having the recesses, being in contact with the electronic circuit component thermally, so that it is accumulated as the latent heat when the heat-accumulating material changes from the solid into the liquid, for example, thereby maintaining the junction temperature of the electronic circuit component to be equal or less than a certain value of temperature. Also, the cooling device, in which the heat-accumulating material within the inside thereof is changed in the phase-condition, can be used repetitively, by letting the heat accumulating material to radiate the heat accumulated therein into an outside after using the electronic apparatus, so as to turn the heat accumulating material back to the initial condition.

And, it is also possible to dissolve the problem; i.e., the heat accumulating material reduces the volume thereof, as it repeats the phase-change, and an air gap is produced in the contact portion between the semiconductor element and the heat accumulating material, thereby lowering down an amount of heat, which is transferred and accumulated into the heat accumulating material, so that efficiency comes down as the cooling device.

As was fully mentioned in the above, according to the present invention, it ;is possible to provide a portable electronic apparatus having the heat accumulating material, which shows high heat responsibility.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraced therein.

What is claimed is:

1. An electronic apparatus, comprising:

a plate-like member, enclosing a heat-accumulating material of latent heat type within an inside thereof;

a semiconductor element, being connected with said container, thermally; and a housing covering said semiconductor element and said container, wherein a surface of said container, in contact with said semiconductor element, is provided with recess portions in plural numbers thereof, each being recessed in a direction of said heat-accumulating material of latent heat type, so as to enclose said heat-accumulating material of latent heat type into said recess portions, and said plate-like member and said housing are connected with each other, thermally.

2. An electronic apparatus, as described in the claim 1, wherein each recess portion provided in said plate-like member, encloses the heat-accumulating material of latent heat type therein, and a another material of heat conductivity is inserted into said recess portion provided in said plate-like member.

3. An electronic apparatus, as described in the claim 1, further comprising means for detecting either one of temperature of said heat-accumulating material of latent heat type and an operation time of said apparatus, and a display portion inputting an output from said detecting means, so as to display a content detected by said detecting means thereupon.

* * * * *